United States Patent
Vaartstra

(10) Patent No.: US 7,041,609 B2
(45) Date of Patent: May 9, 2006

(54) SYSTEMS AND METHODS FOR FORMING METAL OXIDES USING ALCOHOLS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 10/229,473

(22) Filed: Aug. 28, 2002

(65) Prior Publication Data

(51) Int. Cl.
*H01L 21/31* (2006.01)
(52) U.S. Cl. .................. 438/785; 438/240; 438/643; 438/681
(58) Field of Classification Search ........ 438/680–681, 438/643, 648, 653, 656, 685–686, 688, 785–786, 438/240, 253, 254, 396, 3, 778; 257/295, 257/310
See application file for complete search history.

(56) References Cited

U.S. PATENT DOCUMENTS

| | | | |
|---|---|---|---|
| 5,195,018 A * | 3/1993 | Kwon et al. ............. 361/313 |
| 6,020,243 A | 2/2000 | Wallace et al. |
| 6,040,594 A * | 3/2000 | Otani ...................... 257/295 |
| 6,060,755 A | 5/2000 | Ma et al. |
| 6,203,613 B1 | 3/2001 | Gates et al. |
| 6,221,712 B1 | 4/2001 | Huang et al. |
| 6,273,951 B1 | 8/2001 | Vaartstra |
| 6,300,203 B1 | 10/2001 | Buynoski et al. |
| 6,313,035 B1 | 11/2001 | Sandhu et al. |
| 6,313,233 B1 | 11/2001 | Kurosawa et al. |
| 6,316,064 B1 | 11/2001 | Onozawa et al. |
| 6,335,049 B1 | 1/2002 | Basceri |
| 6,541,280 B1 * | 4/2003 | Kaushik et al. ............ 438/3 |
| 6,573,182 B1 | 6/2003 | Sandhu |
| 6,586,792 B1 * | 7/2003 | Ahn et al. |
| 6,674,169 B1 | 1/2004 | Sandhu |
| 6,869,638 B1 | 3/2005 | Baum et al. |
| 6,884,675 B1 | 4/2005 | Chung et al. |
| 6,884,719 B1 | 4/2005 | Chang et al. |
| 2001/0023120 A1 | 9/2001 | Tsunashima et al. |
| 2001/0024387 A1 | 9/2001 | Raaijmakers et al. |
| 2001/0041374 A1 | 11/2001 | Hintermaier et al. |
| 2001/0053615 A1 | 12/2001 | Lim |
| 2002/0175393 A1 | 11/2002 | Baum et al. |

(Continued)

FOREIGN PATENT DOCUMENTS

EP    1 048 627 A2    11/2000

(Continued)

OTHER PUBLICATIONS

Gordon et al., Vapor Deposition of Metal Oxides and Silicates: Possible Gate Insulators for Future Microelectronics, *Chem. Mater.*, 2001; 13:2463-4. Available online Jul. 10, 2001.

(Continued)

*Primary Examiner*—Hoai Pham
*Assistant Examiner*—Dilinh Nguyen
(74) *Attorney, Agent, or Firm*—Mueting, Raasch & Gebhardt, P.A.

(57) ABSTRACT

A method of forming (and an apparatus for forming) a metal oxide layer on a substrate, particularly a semiconductor substrate or substrate assembly, using a vapor deposition process, one or more alcohols, and one or more metal-containing precursor compounds.

40 Claims, 3 Drawing Sheets

U.S. PATENT DOCUMENTS

| | | |
|---|---|---|
| 2002/0187644 A1 | 12/2002 | Baum et al. |
| 2003/0113480 A1 | 6/2003 | Kil et al. |
| 2003/0213987 A1* | 11/2003 | Basceri et al. ............... 257/296 |
| 2004/0043149 A1* | 3/2004 | Gordon et al. ......... 427/255.31 |
| 2004/0046197 A1 | 3/2004 | Basceri et al. |
| 2005/0054213 A1 | 3/2005 | Derderian et al. |
| 2005/0070126 A1 | 3/2005 | Senzaki |

FOREIGN PATENT DOCUMENTS

| | | |
|---|---|---|
| EP | 1 166 900 A2 | 1/2002 |
| EP | 1 193 309 A1 | 4/2002 |
| JP | 5-239650 | 9/1993 |
| JP | 2001 108199 | 4/2001 |
| JP | 2002 060944 | 2/2002 |
| JP | 2003 347297 | 12/2003 |
| WO | WO 95/26355 | 10/1995 |
| WO | WO 02/27063 | 4/2002 |
| WO | WO 2004/020689 | 3/2004 |
| WO | WO 2004/020690 | 3/2004 |
| WO | WO 2004/020691 | 3/2004 |

OTHER PUBLICATIONS

Hawley, *The Condensed Chemical Dictionary*, 10$^{th}$ Edition, Van Nostrand Reinhold Co., New York, 1981; 225-226.

Hiltunen et al., "Growth and characterization of aluminium oxide thin films deposited from various source materials by atomic layer epitaxy and chemical vapor deposition processes," *Materials Chemistry and Physics*, 1991; 28:379-388.

Jeon et al., "Atomic Layer Deposition of $Al_2O_3$ Thin Films Using Trimethylaluminum and Isopropyl Alcohol," *Journal of the Electrochemical Society*, 2002; 149(6):C306-C310. Available online Apr. 12, 2002.

Qi et al., Ultrathin Zirconium silicate film with good thermal stability for alternative gate dielectric application, *Applied Physics Letters*, 2000, Sep. 11; 77(11):1704-6.

Ritala et al., "Atomic Layer Deposition of Oxide Thin Films with Metal Alkoxides as Oxygen Sources," *Science*, 2000; 288:319-21.

Wilk et al., "Hafnium and zirconium silicates for advanced gate dielectrics," *Journal of Applied Physics*, 2000, Jan. 1; 87(1):484-92.

Vehkamäki et al., "Growth of $SrTiO_3$ and $BaTiO_3$ Thin Films by Atomic Layer Deposition," *Electrochemical and Solid-State Letters*, 1999; 2(10):504-6.

Vioux, "Nonhydrolytic Sol-Gel Routes to Oxides," *Chem. Mater.*, 1997; 9(11):2292-9.

Killworth, "What is a patent?" *Vacuum Technology & Coating*, May 2002: 32-34, 36-39.

Hendrix et al., "Comparison of MOCVD precursors for Hf/sub 1-x/Si/Sub x/O/sub 2/gate dielectric deposition," *Silicon Materials—Processing, Characterization and Reliability Symposium (Mater. Res. Soc. Proc.)*, Apr. 2002;716: 273-278.

* cited by examiner

SYSTEMS AND METHODS FOR FORMING METAL OXIDES USING ALCOHOLS

FIELD OF THE INVENTION

This invention relates to methods of forming a metal oxide layer on a substrate using one or more alcohols and one or more metal-containing precursor compounds during a vapor deposition process. The precursor compounds and methods are particularly suitable for the formation of a metal oxide layers on semiconductor substrates or substrate assemblies.

BACKGROUND OF THE INVENTION

The continuous shrinkage of microelectronic devices such as capacitors and gates over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material with silicon to construct microelectronic devices. However, when the $SiO_2$ layer is thinned to 1 nm (i.e., a thickness of only 4 or 5 molecules), as is desired in the newest micro devices, the layer no longer effectively performs as an insulator due to the tunneling current running through it.

Thus, new high dielectric constant materials are needed to extend device performance. Such materials need to demonstrate high permittivity, barrier height to prevent tunneling, stability in direct contact with silicon, and good interface quality and film morphology. Furthermore, such materials must be compatible with the gate material, electrodes, semiconductor processing temperatures, and operating conditions.

High quality thin oxide films of metals, such as $ZrO_2$, $HfO_2$, $Al_2O_3$, and YSZ deposited on semiconductor wafers have recently gained interest for use in memories (e.g., dynamic random access memory (DRAM) devices, static random access memory (SRAM) devices, and ferroelectric memory (FERAM) devices). These materials have high dielectric constants and therefore are attractive as replacements in memories for $SiO_2$ where very thin layers are required. These metal oxide layers are thermodynamically stable in the presence of silicon, minimizing silicon oxidation upon thermal annealing, and appear to be compatible with metal gate electrodes. Specifically, for gate dielectrics, $La_2O_3$, $HfO_2$, and $ZrO_2$ are also promising as they possess relatively high values for permittivity and bandgap.

This discovery has led to an effort to investigate various deposition processes to form layers, especially dielectric layers, based on metal oxides. Such deposition processes have included vapor deposition, metal thermal oxidation, and high vacuum sputtering. Vapor deposition processes, which includes chemical vapor deposition (CVD) and atomic layer deposition (ALD), are very appealing as they provide for excellent control of dielectric uniformity and thickness on a substrate. But vapor deposition processes typically involve the co-reaction of reactive metal precursor compounds with an oxygen source such as oxygen or water, either of which can cause formation of an undesirable $SiO_2$ interfacial layer. Thus, an effort is underway to develop water- and oxygen-free vapor deposition processes.

Ritala et al., "Atomic Layer Deposition of Oxide Thin Films with Metal Alkoxides as Oxygen Sources," SCIENCE, 288:319–321 (2000) describe a chemical approach to ALD of thin oxide films. In this approach, a metal alkoxide, serving as both a metal source and an oxygen source, reacts with another metal compound such as a metal chloride or metal alkyl to deposit a metal oxide on silicon without creating an interfacial silicon oxide layer. However, undesirable chlorine residues can also be formed. Furthermore, zirconium and hafnium alkyls are generally unstable and not commercially available. They would also likely leave carbon in the resultant films.

Despite these continual improvements in semiconductor dielectric layers, there remains a need for a vapor deposition process utilizing sufficiently volatile metal precursor compounds that can form a thin, high quality oxide layer, particularly on a semiconductor substrate using a vapor deposition process.

SUMMARY OF THE INVENTION

This invention provides methods of vapor depositing a metal oxide layer on a substrate. These vapor deposition methods involve forming the layer by combining one or more alcohols with one or more metal organo-amine precursor compounds (e.g., alkylamines or alkylimines-alkylamines) and/or metal alkyl precursor compounds. Significantly, the methods of the present invention do not require the use of water or a strong oxidizer, thus reducing (and typically avoiding) the problems of producing an undesirable interfacial oxide layer between the desired metal oxide layer and the substrate, and oxidizing other layers beneath the top layer. Typically and preferably, the layer is a dielectric layer.

The methods of the present invention involve forming a metal oxide layer on a substrate, such as a semiconductor substrate or substrate assembly in the manufacturing of a semiconductor structure. Such methods include: providing a substrate (preferably, a semiconductor substrate or substrate assembly); providing at least one alcohol of the formula $R(OH)_r$ wherein R is an organic group and r is 1 to 3; providing at least one metal-containing precursor compound of the formula $M^1(NR^1)_w(NR^2R^3)_z$ (Formula I), $M^2R^4_q$ (Formula II), or Lewis Base adducts of Formula II; and contacting the precursor compounds to form a metal oxide layer on one or more surfaces of the substrate using a vapor deposition process. In Formulas I and II: $M^1$ and $M^2$ are each independently a metal (which is used herein to include metalloids or semimetals); $R^1$, $R^2$, $R^3$, and $R^4$ are each independently hydrogen or an organic group; w is 0 to 4; z is 1 to 8; q is 1 to 5; and w, z, and q are dependent on the oxidation states of the metals.

In a preferred embodiment of the invention, a method is provided that includes: providing a substrate (preferably, a semiconductor substrate or substrate assembly) within a deposition chamber; providing at least one alcohol of the formula $R(OH)_r$ wherein R is an organic group and r is 1 to 3; providing at least one metal-containing precursor compound of the formula $M^1(NR^1)_w(NR^2R^3)_z$ (Formula I), $M^2R^4_q$ (Formula II), or Lewis Base adducts of Formula II; vaporizing the precursor compounds to form vaporized precursor compounds; and directing the vaporized precursor compounds to the substrate to form a metal oxide dielectric layer on one or more surfaces of the substrate. In Formulas I and II: $M^1$ and $M^2$ are each independently a metal; $R^1$, $R^2$, $R^3$, and $R^4$ are each independently hydrogen or an organic group; w is 0 to 4; z is 1 to 8; q is 1 to 5; and w, z, and q are dependent on the oxidation states of the metals.

In another preferred embodiment of the invention, a method of manufacturing a memory device structure is provided. The method includes: providing a substrate having a first electrode thereon; providing at least one alcohol of the formula $R(OH)_r$ wherein R is an organic group and r is 1 to 3; providing at least one metal-containing precursor compound of the formula $M^1(NR^1)_w(NR^2R^3)_z$ (Formula I), $M^2R^4_q$ (Formula II), or Lewis Base adducts of Formula II; vaporizing the precursor compounds to form vaporized precursor compounds; directing the vaporized precursor compounds to the substrate to form a metal oxide dielectric layer on the first electrode of the substrate; and forming a second electrode on the dielectric layer. In Formulas I and II: $M^1$ and $M^2$ are each independently a metal; $R^1$, $R^2$, $R^3$, and $R^4$ are each independently hydrogen or an organic group; w is 0 to 4; z is 1 to 8; q is 1 to 5; and w, z, and q are dependent on the oxidation states of the metals.

Also provided is a vapor deposition apparatus that includes: a vapor deposition chamber having a substrate positioned therein; one or more vessels comprising one or more alcohols of the formula $R(OH)_r$ wherein R is an organic group and r is 1 to 3; one or more vessels comprising one or more precursor compounds of the formula $M_1(NR^1)_w(NR^2R^3)_z$ (Formula I), $M^2R^4_q$ (Formula II), or Lewis Base adducts of Formula II. In Formulas I and II: $M^1$ and $M^2$ are each independently a metal; $R^1$, $R^2$, $R^3$, and $R^4$ are each independently hydrogen or an organic group; w is 0 to 4; z is 1 to 8; q is 1 to 5; and w, z, and q are dependent on the oxidation states of the metals.

The methods of the present invention can utilize a chemical vapor deposition (CVD) process, which can be pulsed, or an atomic layer deposition (ALD) process (a self-limiting vapor deposition process that includes a plurality of deposition cycles, typically with purging between the cycles). Preferably, the methods of the present invention use ALD. For certain ALD processes, the precursor compounds can be alternately introduced into a deposition chamber during each deposition cycle.

"Semiconductor substrate" or "substrate assembly" as used herein refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any metal oxide layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

"Precursor compound" as used herein refers to an alcohol or a metal-containing compound capable of forming, either alone or with other precursor compounds, a metal oxide layer on a substrate in a vapor deposition process.

"Deposition process" and "vapor deposition process" as used herein refer to a process in which a metal oxide layer is formed on one or more surfaces of a substrate (e.g., a doped polysilicon wafer) from vaporized precursor compound(s). Specifically, one or more metal precursor (i.e., metal-containing precursor) compounds are vaporized and directed to one or more surfaces of a heated substrate (e.g., semiconductor substrate or substrate assembly) placed in a deposition chamber. These precursor compounds form (e.g., by reacting or decomposing) a non-volatile, thin, uniform, metal oxide layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds (and any optional reaction gases used) within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

"Atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chemisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE), molecular beam epitaxy (MBE), gas source MBE, organometallic MBE, and chemical beam epitaxy when performed with alternating pulses of precursor compound(s), reaction gas(es), and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (e.g., >30 kcal/mol), comparable in strength to ordinary chemical bonds. The chemisorbed species typically form a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by cherisorption. In ALD one or more appropriate precursor compounds or reaction gases are alternately introduced (e.g., pulsed) into a deposition chamber and chemisorbed onto the surfaces of a substrate. Each sequential introduction of a reactive compound (e.g., one or more precursor compounds and one or more reaction gases) is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood that ALD can alternately utilize one precursor compound, which is chemisorbed, and one reaction gas, which reacts with the chemisorbed species.

DETAILED DESCRIPTION OF PREFERRED EMBODIMENTS OF THE INVENTION

Figure 1:
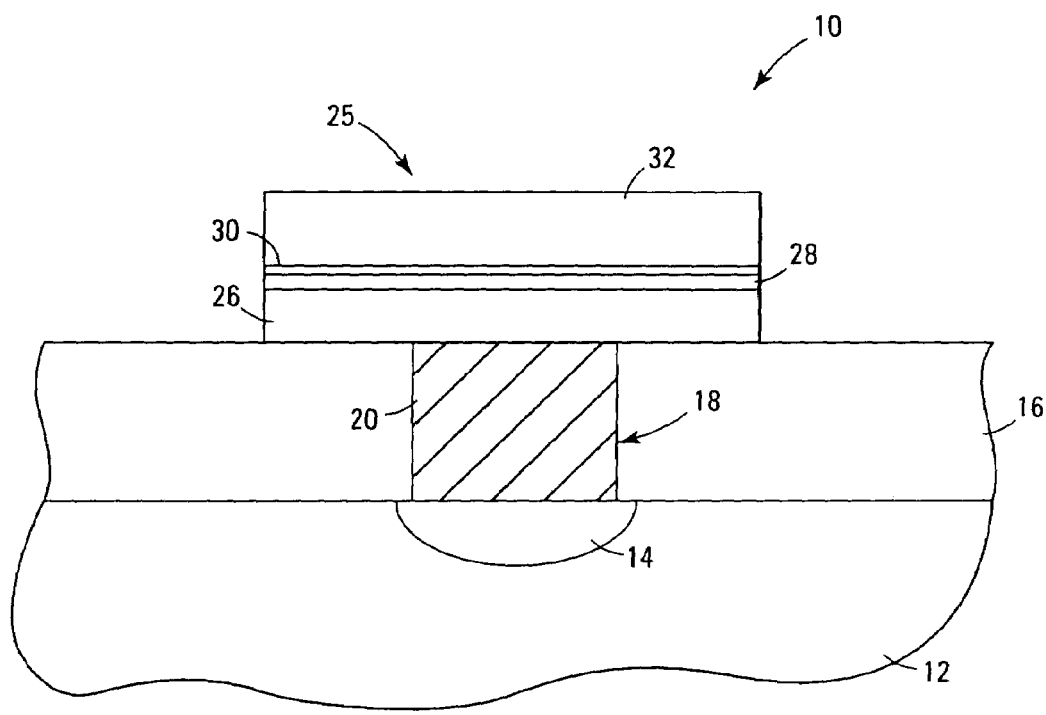
FIGS. 1–3 are exemplary capacitor constructions.

The present invention provides methods of forming a metal oxide layer on a substrate (preferably a semiconductor substrate or substrate assembly) using one or more alcohols of the formula $R(OH)_r$ wherein r is 1 to 3 (preferably, 1) and one or more metal-containing precursor compounds of the formulas $M^1(NR^1)_w(NR^2R^3)_z$ (Formula I), $M^2R^4_q$ (Formula II), or Lewis Base adducts of Formula II. In Formulas I and II: $M^1$ and $M^2$ are each independently any metal (main group, transition metal, lanthamide); each of $R^1$, $R^2$, and $R^3$ is independently hydrogen or an organic group; w is 0 to 4 (preferably, 0 to 2); z is 1 to 8 (preferably, 2 to 6); q is 1 to 5 (preferably, 2 to 3); and w, z, and q are dependent on the oxidation states of the metals.

The metal oxide layer may include one or more different metals and is typically of the formula $M_nO_m$ (Formula III), wherein M can be one or more of $M^1$ and $M^2$ as defined above (i.e., the oxide can be a single metal oxide or a mixed metal oxide). Optionally, the metal oxide layer is a mixed metal oxide (i.e., it includes two or more metals). More preferably, the metal oxide layer includes only one metal.

The metal oxide layer (particularly if it is a dielectric layer) preferably includes one or more of $ZrO_2$, $HfO_2$, $Ta_2O_3$, $Al_2O_3$, $TiO_2$, and an oxide of a lanthamide. A particularly preferred metal oxide layer includes $TiO_2$, which is preferably in the anatase phase.

If the metal oxide layer includes two or more different metals, the metal oxide layer can be in the form of alloys, solid solutions, or nanolaminates. Preferably, these have dielectric properties.

The substrate on which the metal oxide layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and static random access memory (SRAM) devices, for example.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

The precursor compounds described herein may include a wide variety of metals. As used herein, "metal" includes all metals of the periodic table (including main group metals, transition metals, lanthamides, actinides) as well as metalloids or semimetals. For certain methods of the present invention, preferably, each metal M is selected from the group of metals of Groups IIIB (Sc, Y), IVB (Ti, Zr, Hf), VB (V, Nb, Ta), VIB (Cr, Mo, W), VIIB (Mn, Tc, Re), IIIA (Al, Ga, In, Tl), UVA (Si, Ge, Sn, Pb), and the lanthamides (La, Ce, Pr, etc.), which are also referred to as Groups 3–7, 13, 14, and the lanthamides of the Periodic Chart. More preferably, each metal M is selected from the group of metals of Groups IIIB (Sc, Y), UVB (Ti, Zr, Hf), VB (V, Nb, Ta), VIB (Cr, Mo, W), VIIB (Mn, Tc, Re), IVA (Si, Ge, Sn, Pb), and the lanthamides (La, Ce, Pr, etc.), which are also referred to as Groups 3–7, 14, and the lanthamides of the Periodic Chart. Even more preferably, each metal M is selected from the group of metals of Groups IIIB (Sc, Y), IVB (Ti, Zr, Hf), VB (V, Nb, Ta), VIB (Cr, Mo, W), VIIB (Mn, Tc, Re), and the lanthamides (La, Ce, Pr, etc.), which are also referred to as Groups 3–7 and the lanthamides of the Periodic Chart.

For certain embodiments, a preferred group of metals for $M^1$ or $M^2$ is selected from the group of Y, La, Pr, Nd, Gd, Ti, Zr, Hf, Nb, Ta, Si, and Al. For certain other embodiments, a preferred group of metals for $M^2$ is Y, La, Pr, Nd, Gd, Ti, Zr, Hf, Nb, Ta, and Si, and a more preferred group of metals for $M^2$ is Y, La, Pr, Nd, Gd, Ti, Zr, Hf, Nb, and Ta.

Each R in the precursor compounds (i.e., the alcohols and the metalcontaining precursor compounds of the formulas $M_1(NR^1)_w(NR^2R^3)_z$ (Formula I) and $M^2R^4_q$ (Formula II)) are each independently hydrogen or an organic group, preferably an organic group. As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal oxide layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, Si, F, or S atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

For all the precursor compounds (both metal-containing and alcohols) of this invention, each R is independently and preferably hydrogen or an organic group, more preferably a (C1–C10) organic group, even more preferably a (C1–C8) organic group, even more preferably a (C1–C6) organic group, and even more preferably a "lower" (i.e., C1–C4) organic group. Even more preferably, each of these organic groups is an alkyl group. Most preferably, each organic group is an organic moiety, and preferably, an alkyl moiety.

In certain embodiments, the carbon atoms of the R groups of the alcohol precursor compounds can be substituted with fluorine atoms. Preferred alcohols include ethanol, isopropyl alcohol, n-propyl alcohol, n-butanol, and ethylene glycol monomethyl ether.

In certain embodiments, the carbon atoms of the R groups of the metalcontaining precursor compounds are optionally replaced by or substituted with silicon, fluorine, oxygen, and/or nitrogen atoms or groups containing such atoms. Thus, silylated amines and silylated imine-amines are within the scope of Formula I.

For the compounds of Formula I, $M^1(NR^1)_w(NR^2R^3)_z$, $R^1$, $R^2$, and $R^3$ are each preferably a (C1–C6) organic group. Examples of suitable precursor compounds include tetrakis(dimethylamino)titanium, tetrakis(dimethylamino)hafnium, tetrakis(ethylmethylamino)hafnium, and $Al(NMe_2)_2(N(Me)CH_2CH_2NMe_2)$ (wherein Me=methyl). Such compounds are either commercially available from sources such as Strem Chemical Co., or they can be prepared using standard techniques (e.g., by reacting metal chlorides with the corresponding lithium dialkyl amides).

For the compounds of Formula II, $M^2R^4_q$ and Lewis Base adducts thereof, each $R^4$ is preferably hydrogen or a (C1–C4) organic group. Preferably, the compounds of Formula II do not include compounds in which all $R^4$ groups are methyl (particularly when $M^2$ is aluminum). Examples of suitable precursor compounds include $AlH_3$, $AlMe_3$, $AlHMe_2$, $ZnEt_2$ and $AlH_3NMe_3$. Such compounds are either commercially available from sources such as Sigma-Aldrich, or they can be prepared using standard techniques (e.g., by reacting Grignard Reagents with metal halides).

Various precursor compounds can be used in various combinations, optionally with one or more organic solvents (particularly for CVD processes), to form a precursor composition. The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc. Herein, vaporized precursor compounds may be used either alone or optionally with vaporized molecules of other precursor compounds or optionally with vaporized solvent molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

For metal-containing precursors, solvents can be used if desired. The solvents that are suitable for this application (particularly for a CVD process) can be one or more of the following: aliphatic hydrocarbons or unsaturated hydrocarbons (C3–C20, and preferably C5–C10, cyclic, branched, or linear), aromatic hydrocarbons (C5–C20, and preferably C5–C10), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitrites, cyanates, isocyanates, thiocyanates, silicone oils, alcohols, or compounds containing combinations of any of the above or mixtures of one or more of the above. The compounds are also generally compatible with each other, so that mixtures of variable quantities of the precursor compounds will not interact to significantly change their physical properties.

For this invention, preferably no reaction gas is employed to minimize oxidation of the substrate (typically silicon) to its oxide (typically silicon dioxide). That oxidizing process can also cause detrimental oxidation to other substrates such as metal electrodes or nitride barriers. Also, as is known in the art some layers can be pervious to oxidizing gases and cause detrimental oxidation of a layer below the top substrate layer.

The precursor compounds can be vaporized in the presence of an inert carrier gas if desired. Additionally, an inert carrier gas can be used in purging steps in an ALD process. The inert carrier gas is typically selected from the group consisting of nitrogen, helium, argon, and combinations thereof. In the context of the present invention, an inert carrier gas is one that does not interfere with the formation of the metal oxide layer. Whether done in the presence of a inert carrier gas or not, the vaporization is preferably done in the absence of oxygen to avoid oxygen contamination of the layer (e.g., oxidation of silicon to form silicon dioxide).

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal oxide (preferably dielectric) layers onto semiconductor substrates. Using either vapor deposition process, typically one or more precursor compounds are vaporized in a deposition chamber and optionally combined with one or more reaction gases to form a metal oxide layer onto a substrate. It will be readily apparent to one skilled in the art that the vapor deposition process may be enhanced by employing various related techniques such as plasma assistance, photo assistance, laser assistance, as well as other techniques.

The final layer (preferably, a dielectric layer) formed preferably has a thickness in the range of about 10 Å to about 500 Å. More preferably, the thickness of the metal oxide layer is in the range of about 30 Å to about 80 Å.

In most vapor deposition processes, the precursor compound(s) are typically reacted with an oxidizing or reducing reaction gas at elevated temperatures to form the metal oxide layer. However, in the practice of this invention, no such reaction gas is needed because the alcohol provides the oxygen for the film formed. However, oxidizing gases, such as $O_2$, $O_3$, $H_2O$, $H_2O_2$, and $N_2O$ can be used if desired.

Chemical vapor deposition (CVD) has been extensively used for the preparation of metal oxide layers, such as dielectric layers, in semiconductor processing because of its ability to provide highly conformal and high quality dielectric layers at relatively fast processing times. The desired precursor compounds are vaporized and then introduced into a deposition chamber containing a heated substrate with optional reaction gases and/or inert carrier gases. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compound and by the flow of an inert carrier gas bubbled through or passed over the reservoir.

Preferred embodiments of the precursor compounds described herein are particularly suitable for chemical vapor deposition (CVD). The deposition temperature at the substrate surface is preferably held at a temperature in a range of about 100° C. to about 600° C., more preferably in the range of about 200° C. to about 500° C. The deposition chamber pressure is preferably maintained at a deposition pressure of about 0.1 torr to about 10 torr. The partial pressure of precursor compounds in the inert carrier gas is preferably about 0.001 torr to about 10 torr.

Several modifications of the CVD process and chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD (discussed in greater detail below) but does not rigorously avoid intermixing of percursor and reactant gas streams. Also, for pulsed CVD, the deposition thickness is dependent on the exposure time, as opposed to ALD, which is self-limiting (discussed in greater detail below).

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Alternatively, and preferably, the vapor deposition process employed in the methods of the present invention is a multi-cycle ALD process. Such a process is advantageous (particularly over a CVD process) in that in provides for optimum control of atomic-level thickness and uniformity to the deposited layer (e.g., dielectric layer) and to expose the metal precursor compounds to lower volatilization and reaction temperatures to minimize degradation. Typically, in an ALD process, each reactant is pulsed sequentially onto a suitable substrate, typically at deposition temperatures of about 25° C. to about 400° C. (preferably about 150° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkamaki et al, "Growth of $SrTiO_3$ and $BaTiO_3$ Thin Films by Atomic Layer Deposition," Electrochemical and Solid-State Letters, 2(10): 504–506 (1999)).

A typical ALD process includes exposing an initial substrate to a first chemical species (e.g., a precursor compound of Formula I) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different precursor compound of Formula I or a precursor compound of Formula II) is provided to react with the first monolayer of the first species. The second species is then purged and the steps are repeated with exposure of the second species monolayer to the first species. In some cases, the two monolayers may be of the same species. As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species. Optionally, the second species (or third or subsequent) can include at least one reaction gas if desired.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal oxide layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) precursor compounds into the deposition chamber containing a semiconductor substrate, chemisorbing the precursor compound(s) as a monolayer onto the substrate surfaces, and then reacting the chemisorbed precursor compound(s) with the other co-reactive precursor compound(s). The pulse duration of precursor compound(s) and inert carrier gas(es) is sufficient to saturate the substrate surface. Typically, the pulse duration is from about 0.1 to about 5 seconds, preferably from about 0.2 to about 1 second.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the second species or precursor compound can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

For a typical ALD process, the pressure inside the deposition chamber is kept at about $10^{-4}$ torr to about 1 torr, preferably about $10^{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process can be optionally performed in situ in the deposition chamber in a nitrogen atmosphere or oxidizing atmosphere. Preferably, the annealing temperature is within the range of about 400° C. to about 1000° C. Particularly after ALD, the annealing temperature is more preferably about 400° C. to about 750° C., and most preferably about 600° C. to about 700° C. The annealing operation is preferably performed for a time period of about 0.5 minute to about 60 minutes and more preferably for a time period of about 1 minute to about 10 minutes. One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using high dielectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a dielectric layer is formed according to the present invention is a capacitor construction. Exemplary capacitor constructions are described with reference to FIGS. 1–3. Referring to FIG. 1, a semiconductor wafer fragment 10 includes a capacitor construction 25 formed by a method of the present invention. Wafer fragment 10 includes a substrate 12 having a conductive diffusion area 14 formed therein. Substrate 12 can include, for example, monocrystalline silicon. An insulating layer 16, typically borophosphosilicate glass (BPSG), is provided over substrate 12, with a contact opening 18 provided therein to diffusion area 14. A conductive material 20 fills contact opening 18, with material 20 and oxide layer 18 having been planarized as shown. Material 20 might be any suitable conductive material, such as, for example, tungsten or conductively doped polysilicon. Capacitor construction 25 is provided atop layer 16 and plug 20, and electrically connected to node 14 through plug 20.

Capacitor construction 25 includes a first capacitor electrode 26, which has been provided and patterned over node 20. Examplary materials include conductively doped polysilicon, Pt, Ir, Rh, Ru, $RuO_2$, $IrO_2$, $RhO_2$. A capacitor dielectric layer 28 is provided over first capacitor electrode 26. The materials of the present invention can be used to form the capacitor dielectric layer 28. Preferably, if first capacitor electrode 26 includes polysilicon, a surface of the polysilicon is cleaned by an in situ HF dip prior to deposition of the dielectric material. An exemplary thickness for layer 28 in accordance with 256 Mb integration is 100 Angstroms.

A diffusion barrier layer 30 is provided over dielectric layer 28. Diffusion barrier layer 30 includes conductive materials such as TiN, TaN, metal silicide, or metal silicide-nitride, and can be provided by CVD, for example, using conditions well known to those of skill in the art. After formation of barrier layer 30, a second capacitor electrode 32 is formed over barrier layer 30 to complete construction of capacitor 25. Second capacitor electrode 32 can include constructions similar to those discussed above regarding the first capacitor electrode 26, and can accordingly include, for example, conductively doped polysilicon. Diffusion barrier layer 30 preferably prevents components (e.g., oxygen) from diffusing from dielectric material 28 into electrode 32. If, for example, oxygen diffuses into a silicon-containing electrode 32, it can undesirably form $SiO_2$, which will significantly reduce the capacitance of capacitor 25. Diffusion barrier layer 30 can also prevent diffusion of silicon from metal electrode 32 to dielectric layer 28.

Figure 2:
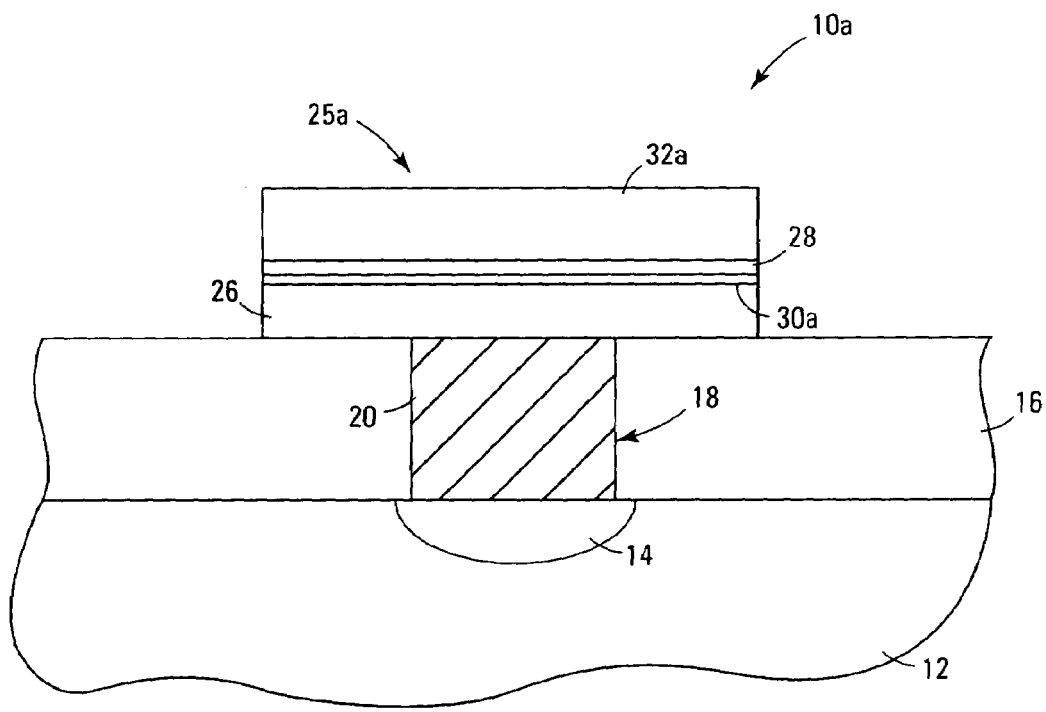

FIG. 2 illustrates an alternative embodiment of a capacitor construction. Like numerals from FIG. 1 have been utilized where appropriate, with differences indicated by the suffix "a". Wafer fragment 10a includes a capacitor construction 25a differing from the construction 25 of FIG. 2 in provision of a barrier layer 30a between first electrode 26 and dielectric layer 28, rather than between dielectric layer 28 and second capacitor electrode 32. Barrier layer 30a can include constructions identical to those discussed above with reference to FIG. 1.

Figure 3:
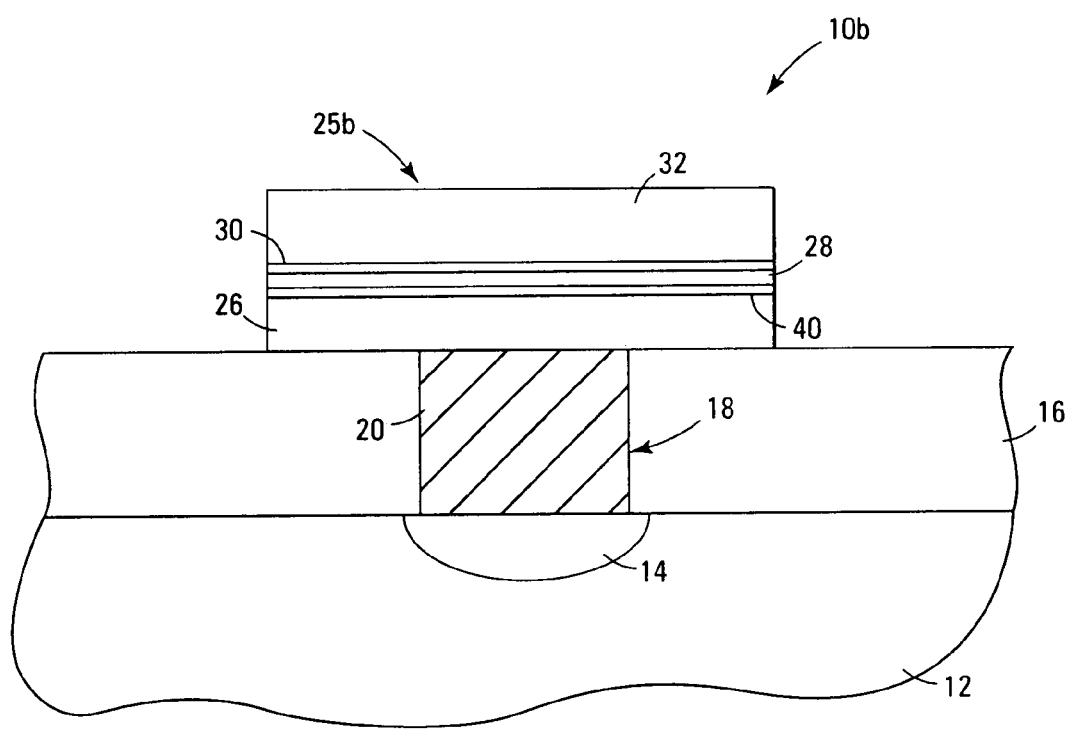

FIG. 3 illustrates yet another alternative embodiment of a capacitor construction. Like numerals from FIG. 1 are utilized where appropriate, with differences being indicated by the suffix "b" or by different numerals. Wafer fragment 10b includes a capacitor construction 25b having the first and second capacitor plate 26 and 32, respectively, of the first described embodiment. However, wafer fragment 10b differs from wafer fragment 10 of FIG. 2 in that wafer fragment 10b includes a second barrier layer 40 in addition to the barrier layer 30. Barrier layer 40 is provided between first capacitor electrode 26 and dielectric layer 28, whereas barrier layer 30 is between second capacitor electrode 32 and dielectric layer 28. Barrier layer 40 can be formed by methods identical to those discussed above with reference to FIG. 1 for formation of the barrier layer 30.

In the embodiments of FIGS. 1–3, the barrier layers are shown and described as being distinct layers separate from the capacitor electrodes. It is to be understood, however, that the barrier layers can include conductive materials and can accordingly, in such embodiments, be understood to include at least a portion of the capacitorr electrodes. In particular embodiments an entirety of a capacitor electrode can include conductive barrier layer materials.

Figure 4:
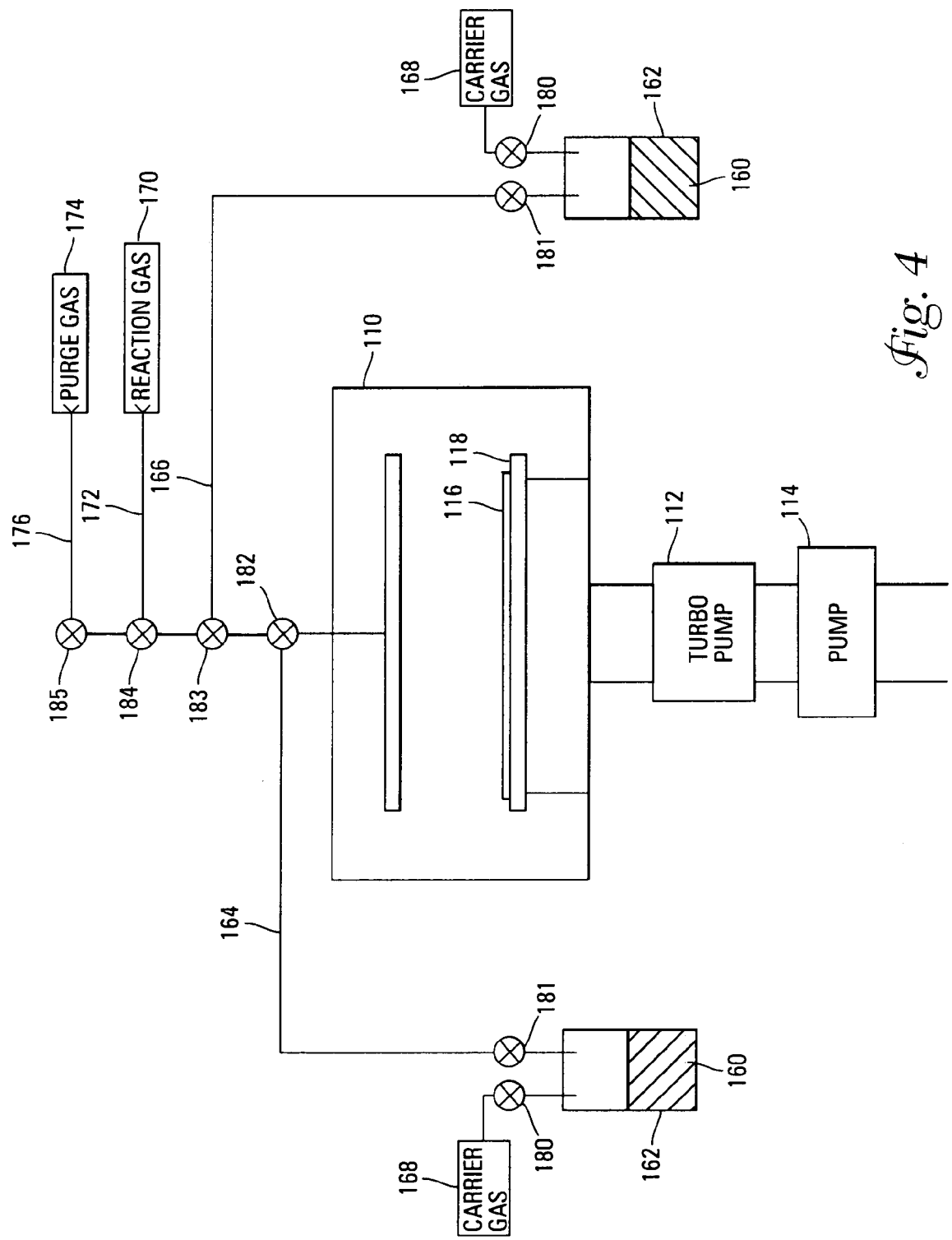
FIG. 4 is a perspective view of a vapor deposition coating system suitable for use in the method of the present invention.

A system that can be used to perform vapor deposition processes (chemical vapor deposition or atomic layer deposition) of the present invention is shown in FIG. 4. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., a refractory metal precursor compound and an ether) are stored in vessels 162. The precursor compounds are vaporized and separately fed along lines 164 and 166 to the deposition chamber 110 using, for example, an inert carrier gas 168. A reaction gas 170 may be supplied along line 172 as needed. Also, a purge gas 174, which is often the same as the inert carrier gas 168, may be supplied along line 176 as needed. As shown, a series of valves 180–185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples. Unless specified otherwise, all percentages shown in the examples are percentages by weight.

EXAMPLES

Example 1

Pulsed Chemical Vapor Deposition of $TiO_2$

A chamber of configuration shown in FIG. 4 was set up with pneumatic valves under computer control to pulse the valves open in sequential manner. Two reservoirs connected to the chamber contained $Ti(NMe_2)_4$ (Strem Chemical, Newburyport, Mass.) and isopropyl alcohol (General Chemical, Parsippany, N.J.). The substrate was a silicon wafer having doped poly-silicon as a top layer and was maintained at 220° C. for the deposition.

Each cycle involved a 5-second pulse of $Ti(NMe_2)_4$ and a 5-second pulse of isopropyl alcohol, each separated by a 5-second purge with argon and a 5-second pump down under dynamic vacuum. The precursors were introduced without helium carrier gas, using only a mass flow controller downstream of the isopropyl alcohol reservoir set at 50 sccm. After 400 cycles a $TiO_2$ film 1750 Å thick was obtained. The film contained only titanium and oxygen based on x-ray photoelectron spectroscopy (XPS) analysis, and had no detectable nitrogen or carbon. X-ray diffraction analysis of the film revealed the anatase crystal phase had been formed as-deposited.

Example 2

Atomic Layer Deposition of $HfO_2$

A chamber of configuration shown in FIG. 4 was set up with pneumatic valves under computer control to pulse the valves open in sequential manner. Two reservoirs connected to the chamber contained $Hf(NMe_2)_4$ (Strem Chemical, Newburyport, Mass.) and isopropyl alcohol (General Chemical, Parsippany, N.J.). The $Hf(NMe_2)_4$ precursor was heated to 40° C. while the isopropyl alcohol remained at ambient. The substrate was a silicon wafer having doped poly-silicon as a top layer and was maintained at 215° C. for the deposition.

Each cycle involved a 2-second pulse of $Hf(NMe_2)_4$ and a 1-second pulse of isopropyl alcohol, each separated by a 5-second purge with argon and a 5-second pump down under dynamic vacuum. The precursors were introduced without helium carrier gas, using only a mass flow controller downstream of the isopropyl alcohol reservoir set at 25 sccm. After 400 cycles a $HfO_2$ film 250 Å thick was obtained. The film contained only hafnium and oxygen based on x-ray photoelectron spectroscopy (XPS) analysis, and had no detectable nitrogen or carbon within the $HfO_2$ layer. X-ray diffraction analysis revealed an amorphous film had been formed as-deposited, but after a 600° C. rapid thermal process (RTP) under nitrogen for 1 min the film was crystalline $HfO_2$.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of forming a metal oxide layer on a substrate, the method comprising:
    providing a substrate;
    providing at least one alcohol of the formula $R(OH)_r$, wherein R is an organic group and r is 1 to 3;
    providing at least one metal-containing precursor compound of the formula $M^1(NR^1)_w(NR^2R^3)_x$ (Formula I), $M^2R^4_q$ (Formula II), or Lewis Base adducts of Formula II, wherein:
        $M^1$ and $M^2$ are each independently a metal;
        $R^1$, $R^2$, $R^3$, and $R^4$ are each independently hydrogen or an organic group;
        w is 0 to 4;
        z is 1 to 8;
        q is 1 to 5; and
        w, z, and q are dependent on the oxidation states of the metals; and
    contacting the precursor compounds to form a metal oxide layer on the substrate using a vapor deposition process, wherein the metal oxide layer comprises two or more different metals.

2. The method of claim 1 wherein the substrate is a silicon wafer.

3. The method of claim 1 wherein $M^1$ and $M^2$ are each independently selected from the group of metals consisting of Groups 3, 4, 5, 6, 7, 13, 14, and the lanthanides.

4. The method of claim 3 wherein $M^1$ and $M^2$ are each independently selected from the group of metals consisting of Y, La, Pr, Nd, Gd, Ti, Zr, Hf, Nb, Ta, Al, and Si.

5. The method of claim 1 wherein the metal oxide layer has a thickness of about 30 Å to about 80 Å.

6. The method of claim 1 wherein each R is independently a (C1–C10) organic group.

7. The method of claim 1 wherein $R^1$, $R^2$, $R^3$, and $R^4$ are each independently hydrogen or a (C1–C6) organic group.

8. The method of claim 1 wherein w is 0 to 2 and z is 2 to 6.

9. The method of claim 1 wherein q is 2 to 3.

10. A method of forming a metal oxide layer on a substrate, the method comprising:
    providing a substrate;
    providing at least one alcohol of the formula $R(OH)_r$, wherein R is an organic group and r is 1 to 3;
    providing at least one metal-containing precursor compound of the formula $M^1(NR^1)_w(NR^2R^3)_z$ (Formula I), $M^2R^4_q$ (Formula II), or Lewis Base adducts of Formula II, wherein:
        $M^1$ and $M^2$ are each independently a metal;
        $R^1$, $R^2$, $R^3$, and $R^4$ are each independently hydrogen or an organic group;
        w is 0 to 4;
        z is 1 to 8;
        q is 1 to 5; and
        w, z, and q are dependent on the oxidation states of the metals;
    vaporizing the precursor compounds to form vaporized precursor compounds; and
    directing the vaporized precursor compounds to the substrate to form a metal oxide layer on the substrate, wherein the metal oxide layer comprises two or more different metals.

11. The method of claim 10 wherein vaporizing and directing the precursor compounds is accomplished using a chemical vapor deposition process.

12. The method of claim 10 wherein vaporizing and directing the precursor compounds is accomplished using an atomic layer deposition process comprising a plurality of deposition cycles.

13. A method of forming a metal oxide layer on a substrate, the method comprising:
    providing a substrate;
    providing at least one alcohol of the formula $R(OH)_r$, wherein R is an organic group and r is 1 to 3;
    providing at least one metal-containing precursor compound of the formula $M^1(NR^1)_w(NR^2R^3)_z$ (Formula I), $M^2R^4_q$ (Formula II), or Lewis Base adducts of Formula II, wherein:
        $M^1$ and $M^2$ are each independently a metal;
        $R^1$, $R^2$, and $R^3$ are each independently hydrogen or an organic group, and $R^4$ is hydrogen or an organic moiety;
        w is 0 to 4;
        z is 1 to 8;
        q is 1 to 5; and
        w, z, and q are dependent on the oxidation states of the metals; and
    contacting the precursor compounds to form a metal oxide layer on the substrate using a vapor deposition process, wherein the metal oxide layer comprises two or more different metals.

14. A method of forming a metal oxide layer on a substrate, the method comprising:
    providing a substrate;
    providing at least one alcohol of the formula $R(OH)_r$, wherein R is an organic group and r is 1 to 3;
    providing at least one metal-containing precursor compound of the formula $M^1(NR^1)_w(NR^2R^3)_z$ (Formula I), $M^2R^4_q$ (Formula II), or Lewis Base adducts of Formula II, wherein:
        $M^1$ and $M^2$ are each independently a metal;

R¹, R², and R³ are each independently hydrogen or an organic group, and R⁴ is hydrogen or an organic moiety;
w is 0 to 4;
z is 1 to 8;
q is 1 to 5; and
w, z, and q are dependent on the oxidation states of the metals;
vaporizing the precursor compounds to form vaporized precursor compounds; and directing the vaporized precursor compounds to the substrate to form a metal oxide layer on the substrate, wherein the metal oxide layer comprises two or more different metals.

15. A method of forming a metal oxide layer on a substrate, the method comprising:
providing a substrate;
providing at least one alcohol of the formula $R(OH)_r$, wherein R is an organic group and r is 1 to 3;
providing at least one metal-containing precursor compound of the formula $M^1(NR^1)_w(NR^2R^3)_z$ (Formula I), $M^2R^4_q$ (Formula II), or Lewis Base adducts of Formula II, wherein:
$M^1$ and $M^2$ are each independently a metal;
R¹, R², and R³ are each independently hydrogen or an organic group, and R⁴ is hydrogen or an organic moiety;
w is 0 to 4;
z is 1 to 8;
q is 1 to 5; and
w, z, and q are dependent on the oxidation states of the metals; and
contacting the precursor compounds to form a metal oxide layer on the substrate using a vapor deposition process, wherein the metal oxide layer comprises two or more different metals, with the proviso that the precursor compounds do not comprise $AlMe_3$.

16. The method of claim 15 wherein the substrate is a silicon wafer.

17. The method of claim 15 wherein $M^1$ and $M^2$ are each independently selected from the group of metals consisting of Groups 3, 4, 5, 6, 7, 13, 14, and the lanthanides.

18. The method of claim 17 wherein $M^1$ and $M^2$ are each independently selected from the group of metals consisting of Y, La, Pr, Nd, Gd, Ti, Zr, Hf, Nb, Ta, Al, and Si.

19. The method of claim 15 wherein the metal oxide layer has a thickness of about 30 Å to about 80 Å.

20. The method of claim 15 wherein each R is independently a (C1–C10) organic group.

21. The method of claim 15 wherein R¹, R², R³, and R⁴ are each independently hydrogen or a (C1–C6) organic group.

22. The method of claim 15 wherein w is 0 to 2 and z is 2 to 6.

23. The method of claim 15 wherein q is 2 to 3.

24. A method of forming a metal oxide layer on a substrate, the method comprising:
providing a substrate;
providing at least one alcohol of the formula $R(OH)_r$, wherein R is an organic group and r is 1 to 3;
providing at least one metal-containing precursor compound of the formula $M^1(NR^1)_w(NR^2R^3)_z$ (Formula I), $M^2R^4_q$ (Formula II), or Lewis Base adducts of Formula II, wherein:
$M^1$ and $M^2$ are each independently a metal;
R¹, R², and R³ are each independently hydrogen or an organic group, and R⁴ is hydrogen or an organic moiety;
w is 0 to 4;
z is 1 to 8;
q is 1 to 5; and
w, z, and q are dependent on the oxidation states of the metals;
vaporizing the precursor compounds to form vaporized precursor compounds; and
directing the vaporized precursor compounds to the substrate to form a metal oxide layer on the substrate, wherein the metal oxide layer comprises two or more different metals, with the proviso that the precursor compounds do not comprise $AlMe_3$.

25. The method of claim 24 wherein vaporizing and directing the precursor compounds is accomplished using a chemical vapor deposition process.

26. The method of claim 24 wherein vaporizing and directing the precursor compounds is accomplished using an atomic layer deposition process comprising a plurality of deposition cycles.

27. A method of forming a metal oxide layer on a substrate, the method comprising:
providing a substrate;
providing at Jeast one alcohol of the formula $R(OH)_r$, wherein R is an organic group and r is 1 to 3, with the proviso that the at least one alcohol does not comprise isopropyl alcohol;
providing at least one metal-containing precursor compound of the formula $M^1(NR^1)_w(NR^2R^3)_z$ (Formula I), $M^2R^4_q$ (Formula II), or Lewis Base adducts of Fonnula II, wherein:
$M^1$ and $M^2$ are each independently a metal;
R¹, R², and R³ are each independently hydrogen or an organic group, and R⁴ is hydrogen or an organic moiety;
w is 0 to 4;
z is 1 to 8;
q is 1 to 5; and
w, z, and q are dependent on the oxidation states of the metals; and
contacting the precursor compounds to form a metal oxide layer on the substrate using a vapor deposition process, wherein the metal oxide layer comprises two or more different metals.

28. The method of claim 27 wherein the substrate is a silicon wafer.

29. The method of claim 27 wherein $M^1$ and $M^2$ are each independently selected from the group of metals consisting of Groups 3, 4, 5, 6, 7, 13, 14, and the lanthanides.

30. The method of claim 29 wherein $M^1$ and $M^2$ are each independently selected from the group of metals consisting of Y, La, Pr, Nd, Gd, Ti, Zr, Hf, Nb, Ta, Al, and Si.

31. The method of claim 27 wherein the metal oxide layer has a thickness of about 30 Å to about 80 Å.

32. The method of claim 27 wherein each R is independently a (C1–C10) organic group.

33. The method of claim 27 wherein R¹, R², R³ and R⁴ are each independently hydrogen or a (C1–C6) organic group.

34. The method of claim 27 wherein w is 0 to 2 and z is 2 to 6.

35. The method of claim 27 wherein q is 2 to 3.

36. A method of forming a metal oxide layer on a substrate, the method comprising:
providing a substrate;
providing at least one alcohol of the formula $R(OH)_r$, wherein R is an organic group and r is 1 to 3, with the proviso that the at least one alcohol does not comprise isopropyl alcohol;

providing at least one metal-containing precursor compound of the formula $M^1(NR^1)_w(NR^2R^3)_z$ (Formula I), $M^2R^4_q$ (Formula II), or Lewis Base adducts of Formula II, wherein:
  $M^1$ and $M^2$ are each independently a metal;
  $R^1$, $R^2$, and $R^3$ are each independently hydrogen or an organic group, and $R^4$ is hydrogen or an organic moiety;
  w is 0 to 4;
  z is 1 to 8;
  q is 1 to 5; and
  w, z, and q are dependent on the oxidation sates of the metals;
vaporizing the precursor compounds to form vaporized precursor compounds; and
directing the vaporized precursor compounds to the substrate to form a metal oxide layer on the substrate, wherein the metal oxide layer comprises two or more different metals.

37. The method of claim 36 wherein vaporizing and directing the precursor compounds is accomplished using a chemical vapor deposition process.

38. The method of claim 36 wherein vaporizing and directing the precursor compounds is accomplished using an atomic layer deposition process comprising a plurality of deposition cycles.

39. A method of forming a metal oxide layer on a substrate, the method comprising:
  providing a substrate;
  providing at least one alcohol of the formula $R(OH)_r$, wherein R is an organic group and r is 1 to 3, with the proviso that the at least one alcohol does not comprise isopropyl alcohol;
  providing at least one metal-containing precursor compound of the formula $M^1(NR^1)_w(NR^2R^3)_z$ (Formula I), $M^2R^4_q$ (Formula II), or Lewis Base adducts of Formula II, wherein:
    $M^1$ and $M^2$ are each independently a metal;
    $R^1$, $R^2$, and $R^3$ are each independently hydrogen or an organic group, and $R^4$ is hydrogen or an organic moiety;
    w is 0 to 4;
    z is 1 to 8;
    q is 1 to 5; and
    w, z, and q are dependent on the oxidation states of the metals; and
  contacting the precursor compounds to form a metal oxide layer on the substrate using a vapor deposition process, wherein the metal oxide layer comprises two or more different metals, with the proviso that the precursor compounds do not comprise $AlMe_3$.

40. A method of forming a metal oxide layer on a substrate, the method comprising:
  providing a substrate;
  providing at least one alcohol of the formula $R(OH)_r$, wherein R is an organic group and r is 1 to 3, with the proviso that the at least one alcohol does not comprise isopropyl alcohol;
  providing at least one metal-containing precursor compound of the formula $M^1(NR^1)^w(NR^2R^3)_z$ (Formula I), $M^2R^4_q$ (Formula II), or Lewis Base adducts of Formula II, wherein:
    $M^1$ and $M^2$ are each independently a metal;
    $R^1$, $R^2$, and $R^3$ are each independently hydrogen or an organic group, and $R^4$ is hydrogen or an organic moiety;
    w is 0 to 4;
    z is 1 to 8;
    q is 1 to 5; and
    w, z, and q are dependent on the oxidation states of the metals;
  vaporizing the precursor compounds to form vaporized precursor compounds; and
  directing the vaporized precursor compounds to the substrate to form a metal oxide layer on the substrate, wherein the metal oxide layer comprises two or more different metals, with the proviso that the precursor compounds do not comprise $AlMe_3$.

* * * * *

UNITED STATES PATENT AND TRADEMARK OFFICE
CERTIFICATE OF CORRECTION

| | |
|---|---|
| PATENT NO. | : 7,041,609 B2 |
| APPLICATION NO. | : 10/229473 |
| DATED | : May 9, 2006 |
| INVENTOR(S) | : Brian A. Vaartstra |

It is certified that error appears in the above-identified patent and that said Letters Patent is hereby corrected as shown below:

On Title Page, Item 65, under Prior Publication Data, please add the following prior publication information:
-- US 2004/0043632 A1    March 4, 2004--
-- US 2005/0136689 A9    June 23, 2005--;

In column 2, line 56, please delete "$M_2R^4_q$" and insert --$M^2R^4_q$--;

In column 3, line 5, please delete "$M_2R^4_q$" and insert --$M^2R^4_q$--;

In column 3, line 20, please delete "$M_1(NR^1)$" and insert --$M^1(NR^1)$--;

In column 5, line 33, please delete "lanthamide" and insert --lanthanide--;

In column 5, line 64, please delete "lanthamides" and insert --lanthanides--;

In column 6, line 2, please delete "UVA and insert --IVA-- and please delete "lanthamides" and insert --lanthanides--;

In column 6, line 4, please delete "lanthamides" and insert --lanthanides--;

In column 6, line 6, please delete "UVB" and insert --IVB--;

In column 6, line 8, please delete "lanthamides" and insert --lanthanides--;

In column 6, line 9, please delete "lanthamides" and insert --lanthanides--;

In column 6, line 13, please delete "lanthamides" and insert --lanthanides--;

In column 6, line 14, please delete "lanthamides" and insert --lanthanides--;

In column 6, line 22, please delete "metalcontaining" and insert --metal-containing--;

In column 6, line 23, please delete "$M_1(NR^1)_w(NR^2R^3)_z$" and insert --$M^1(NR^1)_w(NR^2R^3)_z$--;

In column 7, line 27, please delete "metalcontaining" and insert --metal-containing--;

In column 15, line 38, claim 1, please delete "$M^1(NR^1)_w(NR^2R^3)_x$" and insert --$M^1(NR^1)_w(NR^2R^3)_z$--;

UNITED STATES PATENT AND TRADEMARK OFFICE
CERTIFICATE OF CORRECTION

PATENT NO. : 7,041,609 B2
APPLICATION NO. : 10/229473
DATED : May 9, 2006
INVENTOR(S) : Brian A. Vaartstra It is certified that error appears in the above-identified patent and that said Letters Patent is hereby corrected as shown below:

In column 18, line 23, claim 27, please delete "Jeast" and insert --least--;

In column 20, line 20, claim 40, please delete "$M^1(NR^1)^w(NR^2R^3)_z$" and insert --$M^1(NR^1)_w(NR^2R^3)_z$--;

Signed and Sealed this

Fifth Day of December, 2006

JON W. DUDAS
*Director of the United States Patent and Trademark Office*